United States Patent
Bentley et al.

(10) Patent No.: US 9,613,817 B1
(45) Date of Patent: Apr. 4, 2017

(54) METHOD OF ENHANCING SURFACE DOPING CONCENTRATION OF SOURCE/DRAIN REGIONS

(71) Applicant: GLOBALFOUNDRIES Inc., Grand Cayman (KY)

(72) Inventors: Steven Bentley, Menands, NY (US); Vimal Kamineni, Mechanicville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/138,311

(22) Filed: Apr. 26, 2016

(51) Int. Cl.
*H01L 21/285* (2006.01)
*H01L 21/8238* (2006.01)

(52) U.S. Cl.
CPC ........... *H01L 21/28518* (2013.01); *H01L 21/823814* (2013.01); *H01L 21/823871* (2013.01)

(58) Field of Classification Search
CPC ....... H01L 21/28518; H01L 21/823814; H01L 21/823871
USPC .................. 257/192, 314, 408; 438/558, 563
See application file for complete search history.

(56) References Cited

U.S. PATENT DOCUMENTS

| 5,747,378 A | * | 5/1998 | Fan ..................... H01L 21/2255 148/DIG. 144 |
| 2015/0084108 A1 | * | 3/2015 | Saha ............... H01L 21/823807 257/314 |
| 2015/0221651 A1 | * | 8/2015 | Toh ................... H01L 27/10802 257/192 |

* cited by examiner

*Primary Examiner* — Errol Fernandes
(74) *Attorney, Agent, or Firm* — Heslin Rothenberg Farley & Mesiti P.C.

(57) ABSTRACT

A method of enhancing surface diffusion species concentration in source/drain regions includes providing a substrate for an integrated circuit. One of an n-type and a p-type S/D region for a semiconductor device is formed on a surface of the substrate. A top surface of the S/D region is exposed. A diffusion layer is deposited over the top surface of the S/D region, the diffusion layer having a concentration of a diffusion species. The diffusion layer is heated to diffuse the diffusion species into the S/D region to enhance a concentration of the diffusion species proximate the top surface of the S/D region. The diffusion layer is removed from the top surface of the S/D region. A metal layer is deposited over the top surface of the S/D region immediately after removing the diffusion layer. Electrical contacts are formed over the top surface of the S/D region from the metal layer.

12 Claims, 19 Drawing Sheets

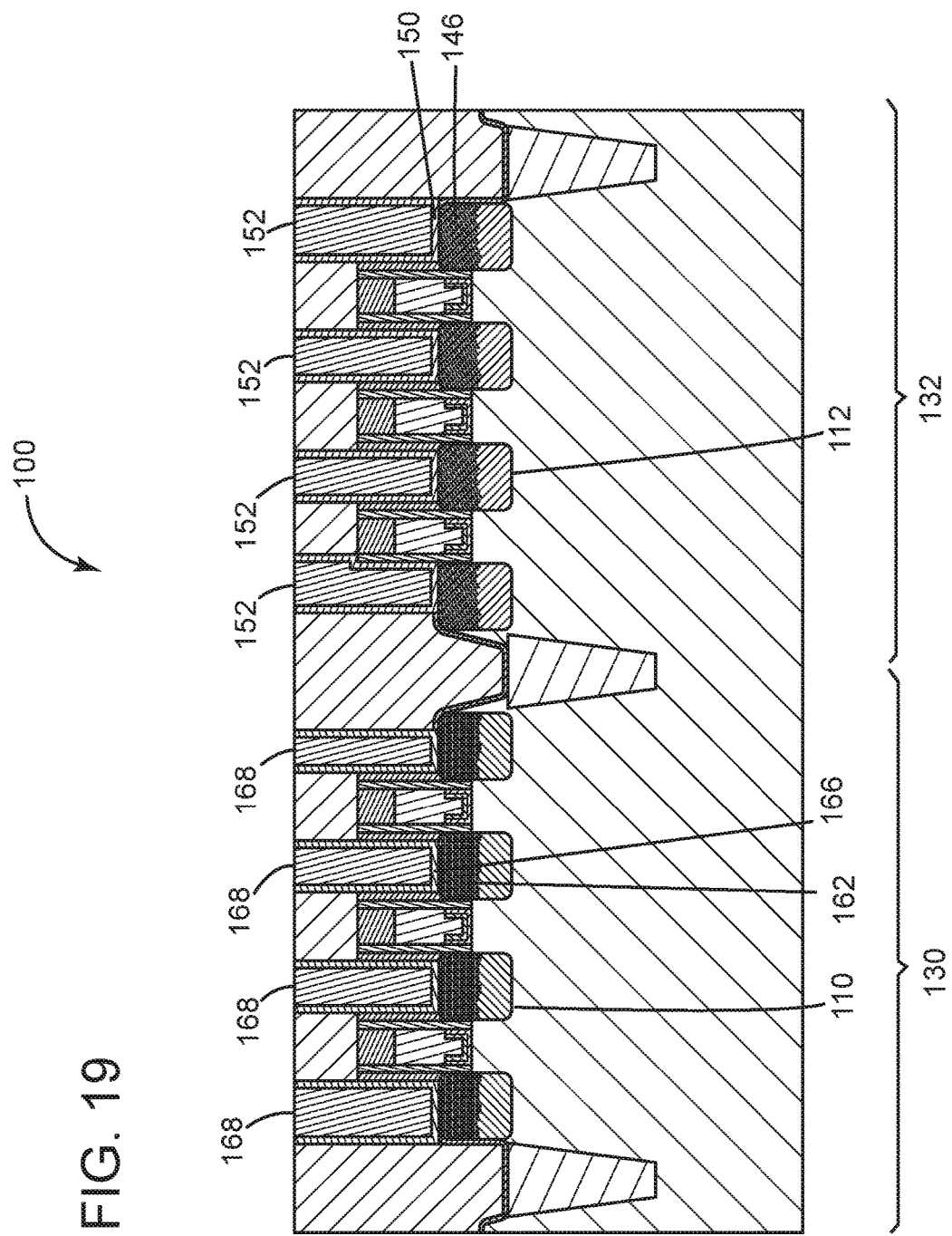

METHOD OF ENHANCING SURFACE DOPING CONCENTRATION OF SOURCE/DRAIN REGIONS

TECHNICAL FIELD

The present invention relates to semiconductor devices and methods of fabricating the same. More specifically, the invention relates to various methods of enhancing surface species (such as dopants and/or alloying elements) concentration in source/drain regions.

BACKGROUND

With constant down-scaling and increasingly demanding requirements to the speed and functionality of ultra-high density integrated circuits, semiconductor devices, such as transistors, diodes, capacitors and the like, need to continuously reduce parasitic resistance between such devices in order to meet performance requirements. A major contributor to parasitic resistance is the contact resistance at the source and drain of the devices in the integrated circuit. To reduce contact resistance, high concentrations of dopants (or dopant species), e.g., phosphorous (P), arsenic (As), boron (B) or the like, are required at the top surface of a device's source and drain (source/drain or S/D) regions.

Additionally, as leading edge integrated circuit technologies scale ever smaller, there is a trend toward higher concentrations of germanium (and other alloying element species) at the surfaces of a devices source/drain regions, partially for strain reasons. This is particularly the case for Ge-containing channels in p-type field effect transistor (p-FET) devices.

Typically, S/D regions of a semiconductor device are epitaxially grown as a series of semiconductor layers to form S/D region epitaxial stacks through a variety of well-known techniques, such as metalorganic chemical vapor deposition or the like. However, S/D regions can be formed by a variety of other well-known techniques, such as implant, plasma, monolayer doping or the like.

Dopant species are generally introduced in-situ during the S/D region formation process. For example, a variety of dopants may be introduced into S/D region epitaxial stacks during the epitaxial growth process. However, it is difficult to dope the S/D regions in-situ in sufficient concentrations to meet state of the art device requirements, particularly in pure germanium (Ge), or silicon-germanium (SiGe) having a high percentage of Ge.

Ion implantation of dopant species, after the initial source/drain formation process, has previously been utilized to further enhance the concentration of dopant in S/D regions. However, high dopant implant doses may cause amorphization and dislocation generation in the S/D regions, which then require subsequent high temperature anneals to reduce the crystalline damage. Such high temperature anneals can undesirably drive the dopant species concentrations away from the surface of the S/D regions as well as modifying the junction gradient in the extension regions. Additionally, ion implantation is not a fully conformal process, which can lead to problematic performance variations from device to device which worsen with reduced pitch and with increased topography.

Additionally, there are various steps in the fabrication of a semiconductor device that frequently require the use of elevated temperature and which occur after the formation of the S/D regions. For example, during gate formation, high temperature annealing steps are often employed. These additional annealing steps will also undesirably diffuse the dopant away from the contact surfaces of the semiconductor's S/D regions and degrade performance.

Accordingly, there is a need for a method to enhance the surface dopant species concentration of source/drain regions in order to decrease contact resistance. There is also a need to enhance the surface concentration of germanium and other alloying element species in source/drain regions. Moreover there is a need for a method to increase such surface dopant species concentrations without damage to the S/D regions and without the need for subsequent high temperature annealing of such S/D regions. More generally, there is a need to minimize the number of annealing steps that S/D regions are subjected to after formation to prevent species outdiffusion.

BRIEF DESCRIPTION

The present invention offers advantages and alternatives over the prior art by providing a method of utilizing solid state diffusion species sources, such as a diffusion layer having a predetermined concentration of diffusion species therein, to deliver the diffusion species to source/drain regions of semiconductor devices immediately prior to contact formation (for example, silicidation). By utilizing solid state diffusion techniques, the concentration of diffusion species (such as dopants or alloying elements) proximate to the surfaces of source/drain regions can be enhanced without damage to the S/D regions. Further, since the diffusion is done immediately prior to electrical contact formation in the S/D regions, additional annealing procedures, which can diffuse and change the concentration of diffusion species near the surface of the S/D regions, are kept to a minimum.

For purposes of clarity, a diffusion species is defined herein as any element or compound that can be diffused from a source material (such as a diffusion layer) into a semiconductor material (such as a semiconductor substrate). A diffusion species can be an n-type dopant, a p-type dopant, an alloying element such as Germanium or the like.

A method of enhancing surface diffusion species concentration of S/D regions in accordance with one or more aspects of the present invention includes providing a substrate for an integrated circuit. One of an n-type and a p-type S/D region for a semiconductor device is formed on a surface of the substrate. A top surface of the S/D region is exposed. A diffusion layer (for example, doped silicate glass, particularly boron-doped silicate glass (BSG) or phosphorus-doped silicate glass (PSG)) is deposited over the top surface of the S/D region, the diffusion layer having a predetermined concentration of a diffusion species. The diffusion layer is heated to diffuse the diffusion species into the S/D region to enhance the diffusion species concentration proximate to the top surface of the S/D region. The diffusion layer is then removed from the top surface of the S/D region. A metal layer is deposited over the top surface of the S/D region immediately after removing the diffusion layer. Electrical contacts are then formed over the top surface of the S/D region from the metal layer.

In another exemplary embodiment of the present invention a method includes providing a substrate for an integrated circuit. A first S/D region to function as a source and a second S/D region to function as a drain for a semiconductor device is formed on a surface of the substrate. Top surfaces of the S/D regions are exposed. A diffusion layer is deposited over the top surfaces of the S/D regions, the diffusion layer having a predetermined concentration of a diffusion species. The diffusion layer is heated to diffuse the diffusion species into the S/D regions to enhance a concentration of the diffusion species proximate the top surfaces of the S/D regions. The diffusion layer is removed from the top surfaces of the S/D regions. A metal layer is deposited over the top surfaces of the S/D regions immediately after removing the diffusion layer. Electrical contacts are then formed over the top surfaces of the S/D regions from the metal layer.

In another exemplary embodiment of the present invention a method includes providing a substrate for an integrated circuit. A plurality of n-type and p-type S/D regions for a plurality of semiconductor devices is formed on a surface of the substrate. Top surfaces of solely one type of the n-type and p-type S/D regions are exposed. A diffusion layer is deposited over the top surfaces of the one type of S/D regions, the diffusion layer having a predetermined concentration of a first diffusion species. The diffusion layer is heated to diffuse the first diffusion species into the one type of S/D regions to enhance a concentration of the first diffusion species proximate the top surfaces of the one type of S/D regions. The diffusion layer is removed from the top surfaces of the one type of S/D regions. A metal layer is deposited over the top surfaces of the one type of S/D regions immediately after removing the diffusion layer. Electrical contacts are then formed over the top surfaces of the one type of S/D regions from the metal layer.

DRAWINGS

The invention will be more fully understood from the following detailed description taken in conjunction with the accompanying drawings, in which.

Figure 17:
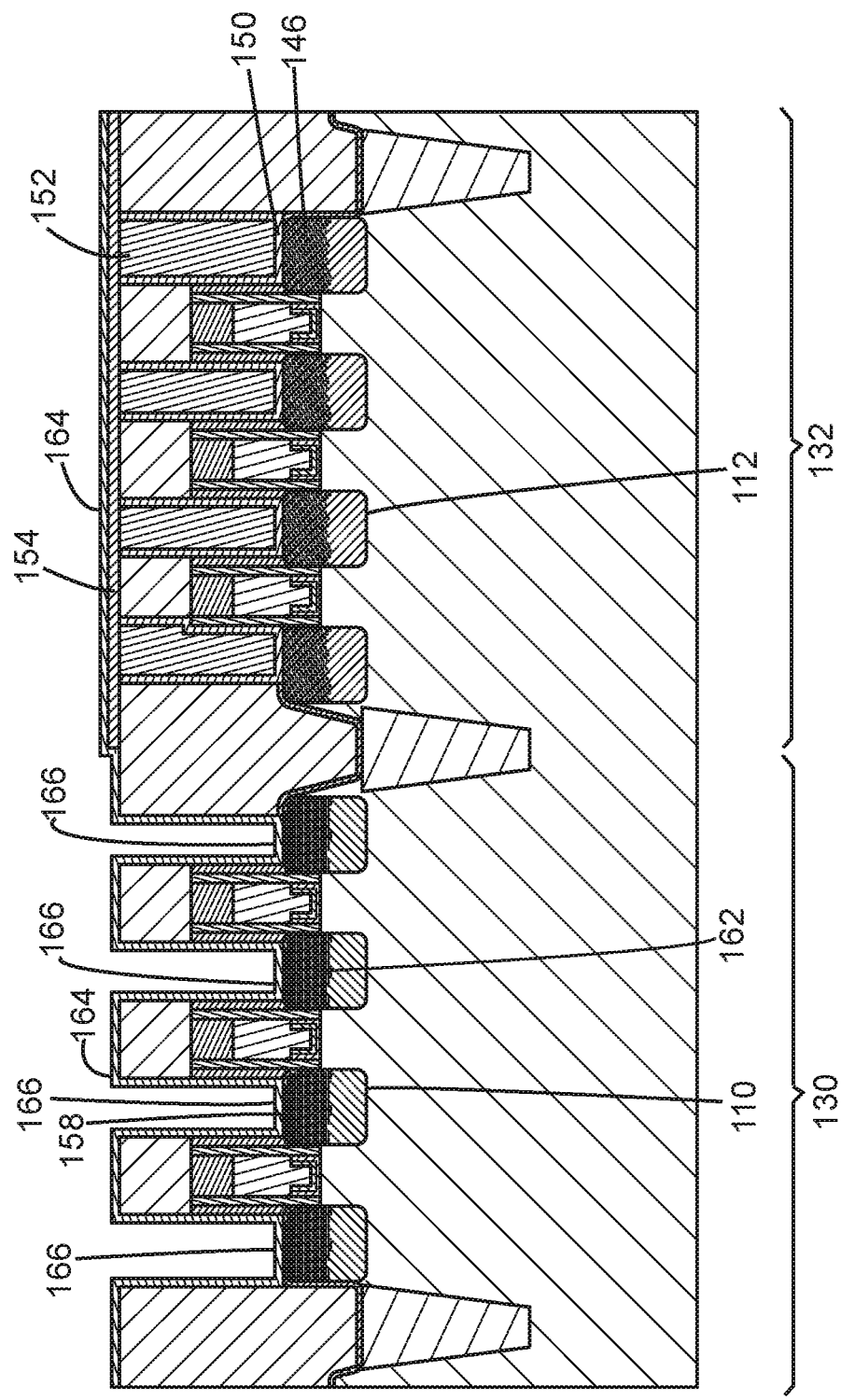
FIG. 17 is a simplified view of the structure of FIG. 16 with a solid state silicide second metal layer, a p-type metal contact liner to lower Schottky barrier height, disposed over the structure in accordance with the present invention.
Figure 18:
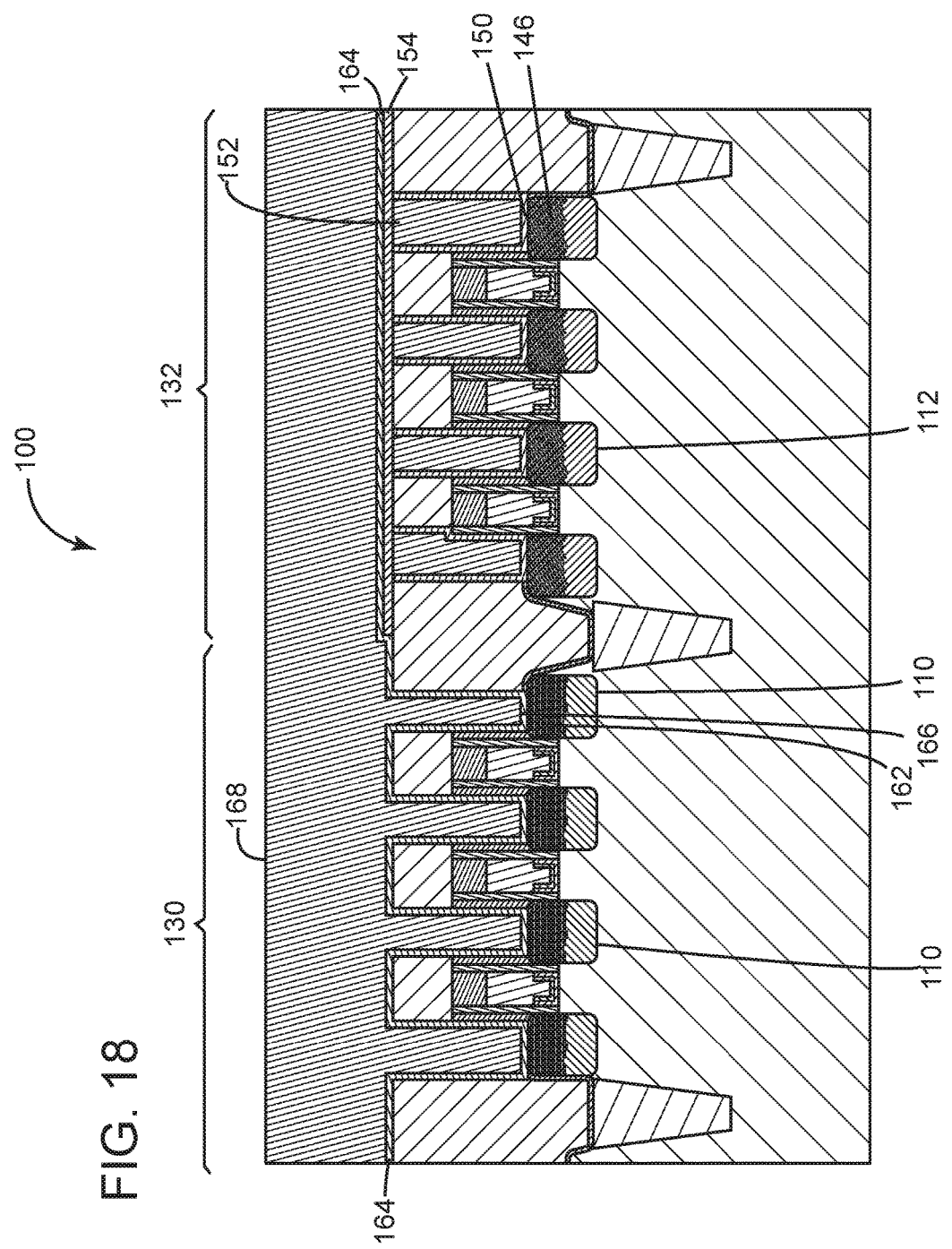

FIG. 18 is a simplified view of the structure of FIG. 17 with a second fill metal disposed over the structure in accordance with the present invention; and FIG. 19 is a simplified view of the structure of FIG. 18 with the structure planarized to expose fill metal on both the p-FET portion and the n-FET portion of the structure to complete the electrical contact formation in accordance with the present invention.

DETAILED DESCRIPTION

Certain exemplary embodiments will now be described to provide an overall understanding of the principles of the structure, function, manufacture, and use of the methods, systems, and devices disclosed herein. One or more examples of these embodiments are illustrated in the accompanying drawings. Those skilled in the art will understand that the methods, systems, and devices specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention.

FIGS. 1-19 illustrate various exemplary embodiments of diffusing surface diffusion species concentrations into source/drain regions in accordance with the present invention.

Figure 1:
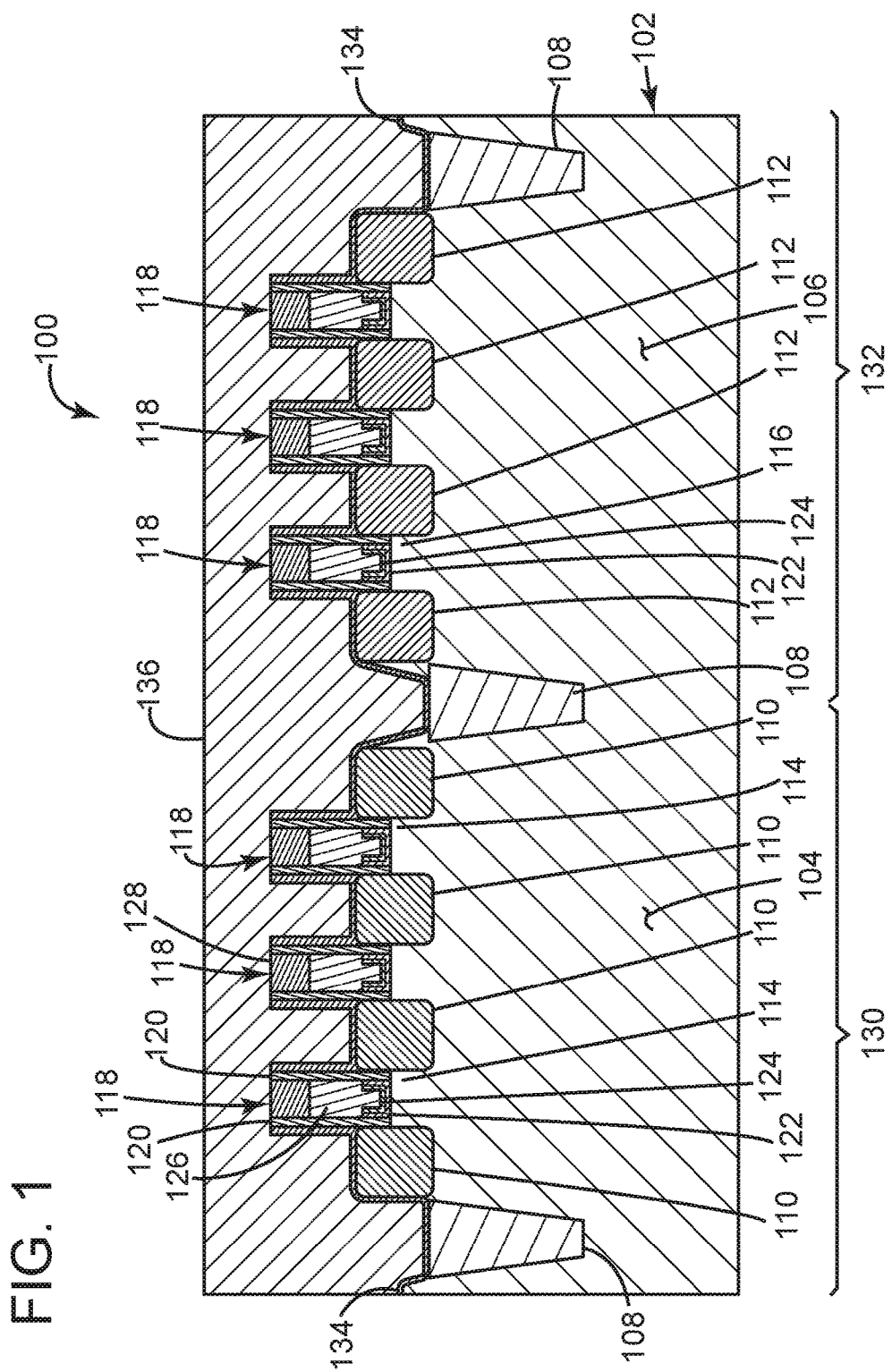
FIG. 1 is a simplified side view of an exemplary embodiment of a structure for an integrated circuit having both p-type S/D regions on a p-FET portion of the structure and n-type S/D regions on an n-FET portion of the structure just prior to electrical contact formation in accordance with the present invention.

Referring to FIG. 1, a simplified view of an exemplary embodiment of a structure 100 for an integrated circuit in accordance with the present invention is presented at an intermediate stage of manufacturing. More specifically structure 100 represents a conventional metal-oxide semiconductor field effect transistor (MOSFET) device just prior to formation of electrical contacts. It is important to note that even though structure 100 represents a MOSFET device, structure 100 could be any one of a number of different types of integrated circuits having any number of semiconductor devices thereon. For example, structure 100 could include finFETs, silicon-on-insulator (SOI) wafers, multiple semiconducting channel materials or the like.

Structure 100 includes a substrate 102. Substrate 102 has a slightly doped n-type portion 104 and a slightly doped p-type portion 106, which are electrically isolated by shallow trench isolation (STI) regions 108. On an upper surface of the n-type portion 104 of substrate 102, a plurality of p-type S/D regions 110 are formed and disposed through various well known techniques, such as epitaxy, implant, plasma, monolayer doping or the like. Additionally, on an upper surface of the p-type portion 106 of substrate 102, a plurality of n-type S/D regions 112 are also grown and disposed.

Typically, the p-type 110 and n-type 112 S/D regions function as source and/or drain regions for MOSFET devices. However, the S/D regions can be utilized as active regions for other types of semiconductor devices as well, e.g. diodes, capacitors or the like. Moreover, even though this particular exemplary embodiment illustrates 4 p-type and 4 n-type S/D regions, the invention applies to any number of S/D regions, e.g., from a single n-type or p-type S/D region to several tens of thousands of S/D regions and more.

Since, in this embodiment, the S/D regions function as source and drain for MOSFET devices, the regions of the substrate between the p-type S/D regions 110 are the channels 114 for p-type transistors. Moreover, the regions of the substrate between the n-type S/D regions 112 are the channels 116 for n-type transistors.

Overlaying the channels 114 and 116 are the transistor gates 118. Each of the gates are bordered by a pair of nitride spacers 120. Each of the gates 118 include a thin high-k dielectric layer 122 disposed directly upon the channels 114 and 116. Disposed over the dielectric layer 122 is a thin layer of working metal 124. Overlaying the working metal layer 122 is the gate interconnect metal 126, which in this particular case is tungsten, but can be other metals as well, such as cobalt or the like. Disposed over the interconnect metal 126 of each gate 118 is an etch mask cap 128, such as a silicon nitride (SiN) cap, which is used to protect the interconnect metal 126 during subsequent process flow steps.

In this exemplary embodiment, the p-type S/D regions 110 and gates 118 can function as a single p-FET device or multiple p-FET devices. Likewise, in this embodiment, the n-type S/D regions 112 and gates 118 can function as a single n-FET device or multiple n-FET devices. The portion of the structure 100 that contains the p-FET device (or devices) can be referred to herein as the p-FET portion 130 of the structure 100. Additionally, the portion of the structure 100 that contains the n-FET device (or devices) can be referred to herein as the n-FET portion 132 of the structure 100.

Additionally, structure 100 includes a protective nitride (or low-k dielectric) liner layer 134, which conformally coats the p-type and n-type S/D regions 110, 112, the gates 118 and the STI regions 108. Disposed over the liner layer 134 is an oxide layer 136.

At this stage of the process flow of structure 100, electrical contact formation is ready to begin. That is, the electrical contacts between the semiconductor devices (and more specifically the S/D regions 110 and 112) on the surface of substrate 102 and an interconnection system (not shown) for the integrated circuit associated with substrate 102 must now be formed. In forming such electrical contacts, care must be taken to assure that contact resistance is minimized as much as possible.

To minimize such contact resistance, it is highly desirable to enhance the concentration of dopant species (or dopants), such as n-type dopants (for example arsenic or phosphorous), p-type dopants (for example boron or gallium) or the like, proximate the top surfaces of the p-type and n-type S/D regions 110 and 112. This is because a greater number of n-type and p-type carriers will inherently increase electrical conductivity and, therefore, lower contact resistance. Moreover, alloying element species (or alloying elements), such as germanium, are often used to induce channel strain by modulation of the lattice constant, which can also increase conductivity and potentially reduce contact resistance.

Furthermore, the height of the well known Schottky barrier is affected by at least such parameters as the work function of the electrical contact metal and the contact resistance. By lowering the contact resistance, a greater choice of contact metals is provided to further reduce the Schottky barrier height for n-type and p-type S/D contacts.

Problematically however, it is difficult to attain the dopant concentrations desired through the in-situ doping processes used during the formation phase of the S/D regions. Additionally, processing at elevated temperature which occurs subsequent to S/D region formation (such as during the formation of the gates 118), is likely to diffuse the dopant away from the S/D region surface.

Ion implantation techniques can be used to enhance or restore dopant concentrations at the surface of the S/D regions. However, such implantation techniques can cause defectively or amorphization, which must be repaired by subsequent annealing processes that can also diffuse the dopant from its optimal location.

The invention described herein provides various methods to overcome such problems. More specifically, the present invention provides methods of utilizing solid state diffusion species sources to introduce high concentrations of diffusion species proximate to the surface of the S/D regions without causing damage to the S/D regions that must later be repaired. Additionally, the methods described herein introduce the diffusion species just prior to contact formation, allowing most of the elevated temperature processing that can affect the concentration and location of diffusion species to be avoided.

For purposes of clarity, a diffusion species is defined herein as any element or compound that can be diffused from a source material (such as a diffusion layer) into a semiconductor material (such as a semiconductor substrate). A diffusion species can be an n-type dopant (such as phosphorous or arsenic), a p-type dopant (such as boron or gallium), an alloying element (such as germanium) or the like.

Figure 2:
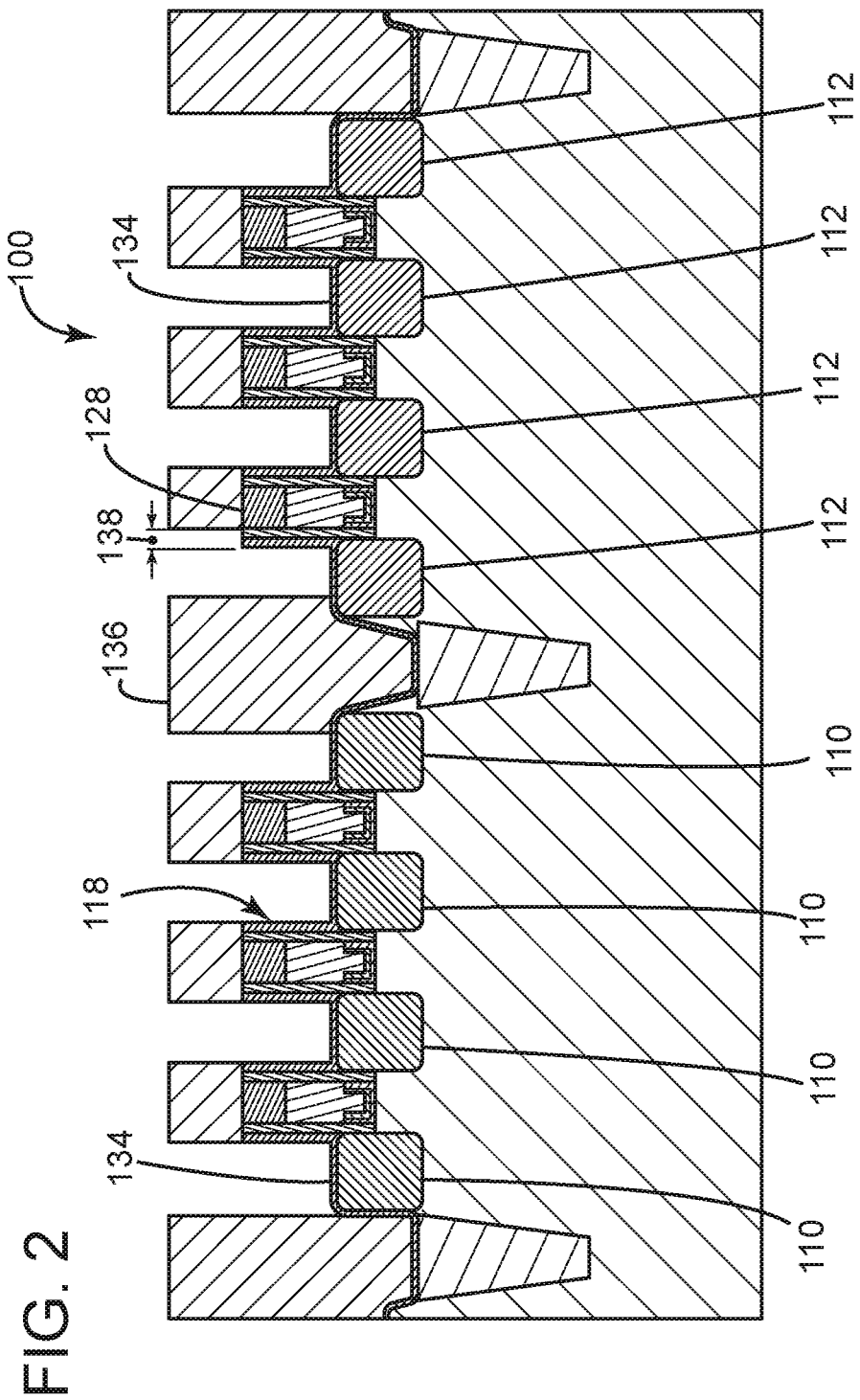
FIG. 2 is a simplified view of the structure of FIG. 1 with portions of a nitride liner layer over the S/D regions exposed in accordance with the present invention.

Referring to FIG. 2, to prepare structure 100 for electrical contact formation, the oxide layer 136 is lithographically patterned and then selectively etched to expose the nitride layer 134 specifically over the p-type and n-type S/D regions 110 and 112. Note that due to lithographic overlay tolerances, the etch process is not always perfect and sometimes exposes small portions 138 of the gates 118 and spacers 120. However, the nitride caps 128 serve as an etch mask to protect the gates 118 from harm during further processing.

Figure 3:
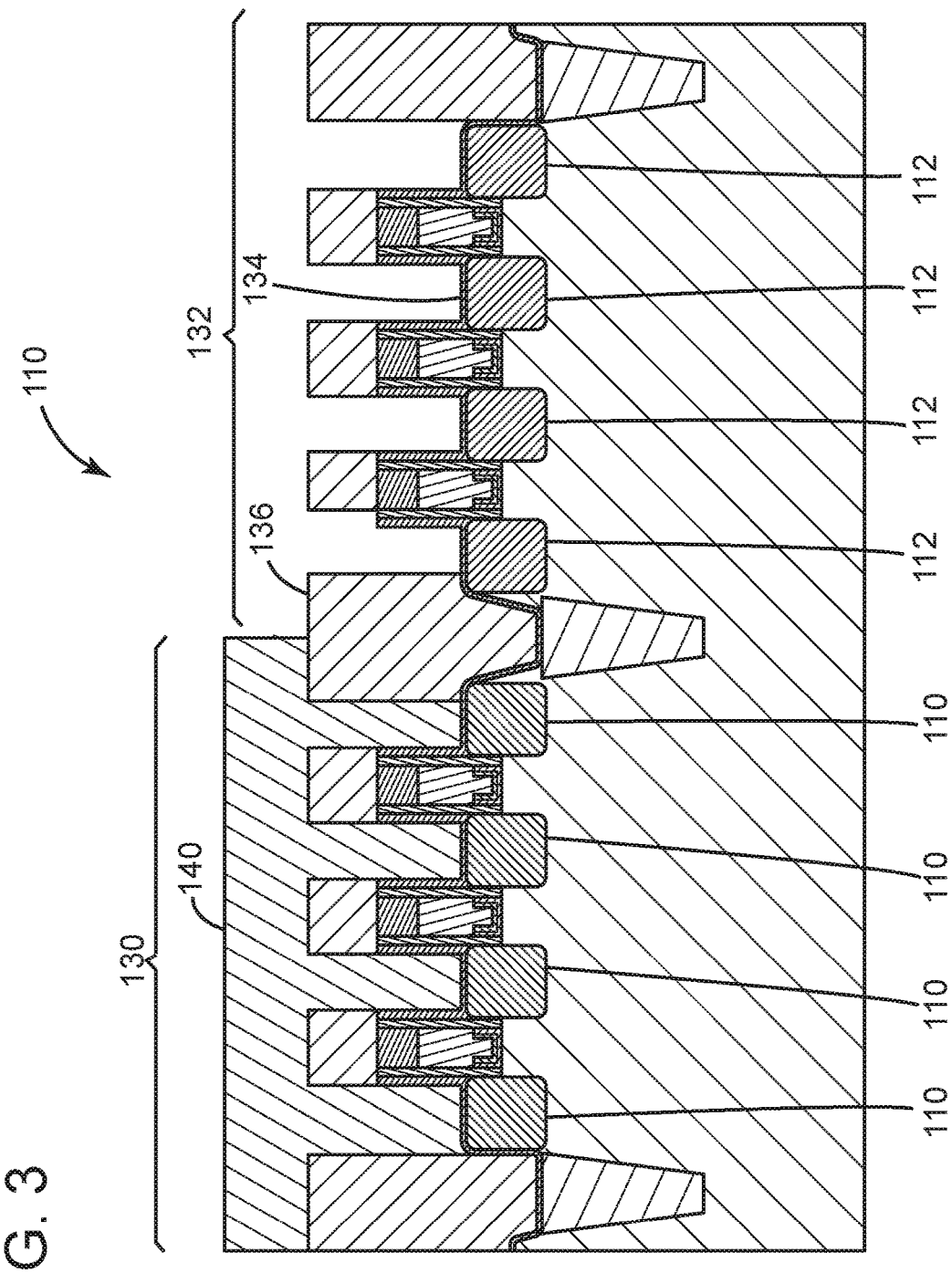
FIG. 3 is a simplified view of the structure of FIG. 2 with a block mask disposed over the p-FET portion of the structure in accordance with the present invention.

Referring to FIG. 3, a block mask 140 is disposed over the p-FET portion 130 of structure 100 to expose only the n-FET portion 132. The block mask may be an organic planarization layer (OPL) or the like.

Figure 4:
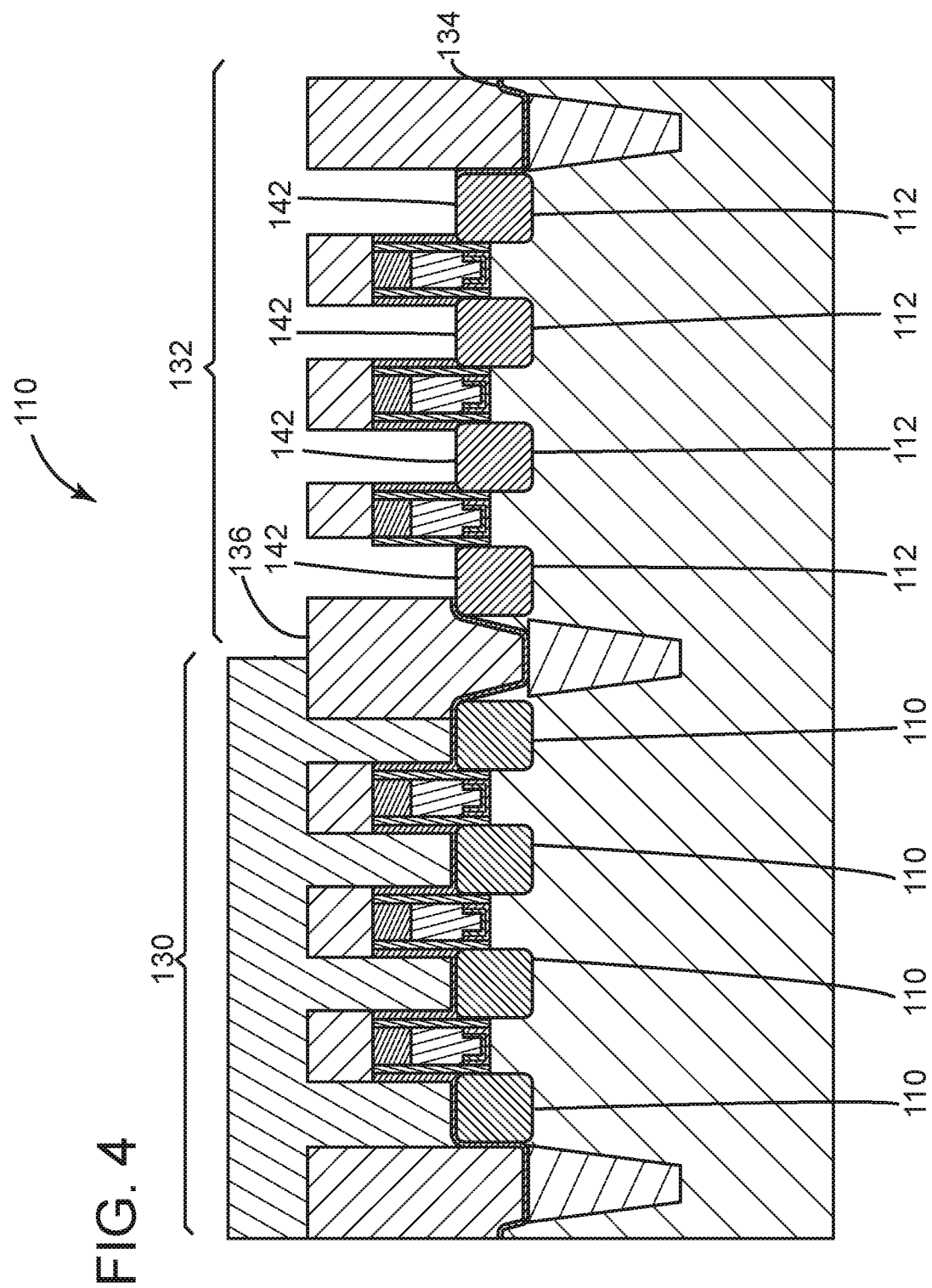
FIG. 4 is a simplified view of the structure of FIG. 3 with top surfaces of the n-type S/D regions exposed in accordance with the present invention.

Referring to FIG. 4, an etch process is used to etch the exposed portions of nitride liner layer 134 away on the n-FET portion 132 of structure 100, which exposes the top surfaces 142 of the n-type S/D regions 112. The etch process is an anisotropic etch, such as a reactive ion etch (RIE).

Figure 5:
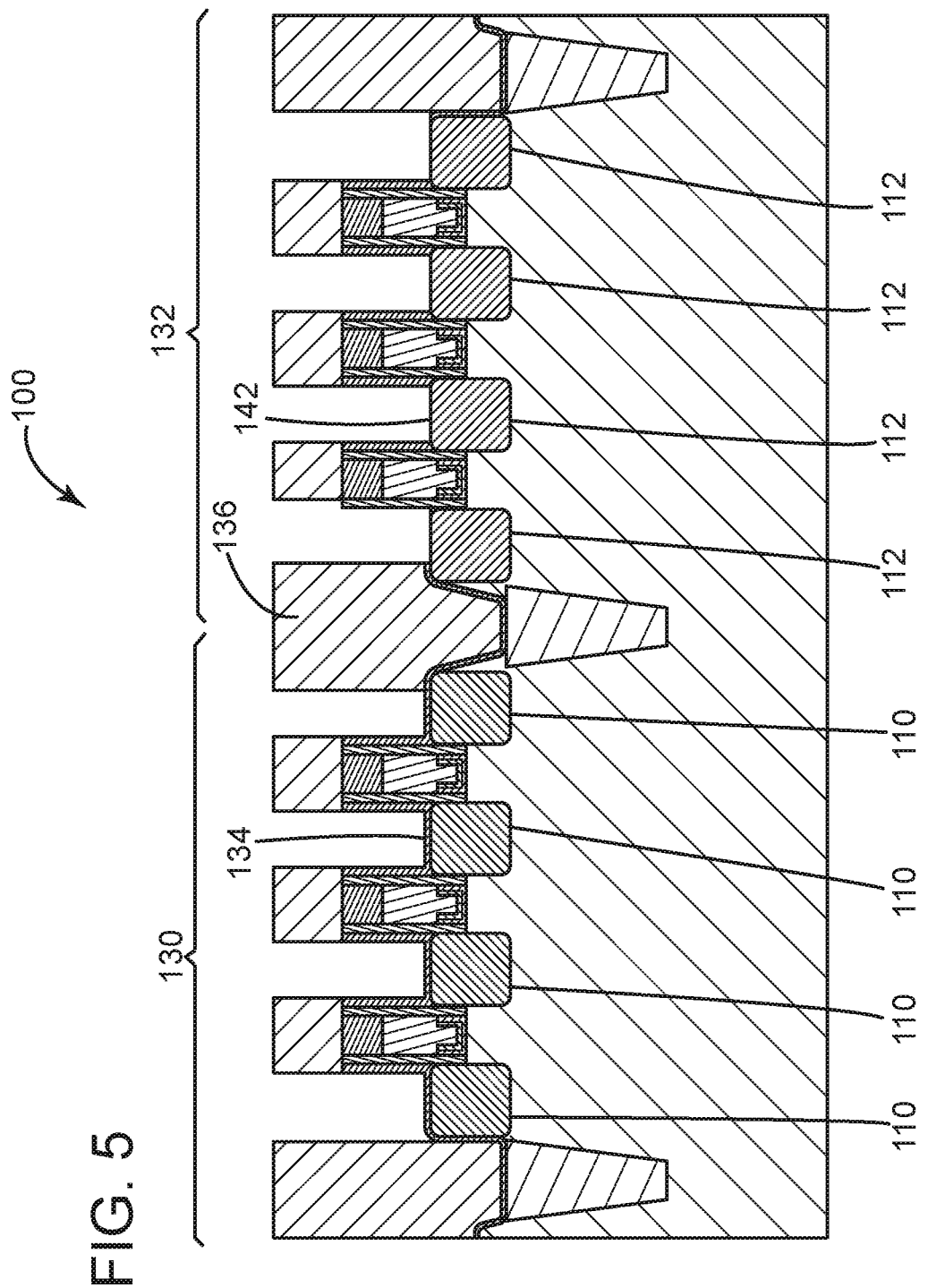
FIG. 5 is a simplified view of the structure of FIG. 4 with the block mask removed in accordance with the present invention.

Referring to FIG. 5, the block mask 140 is stripped away. The liner layer 134 remains overlaying the p-type S/D regions 110 on the p-FET portion of structure 100.

Figure 6:
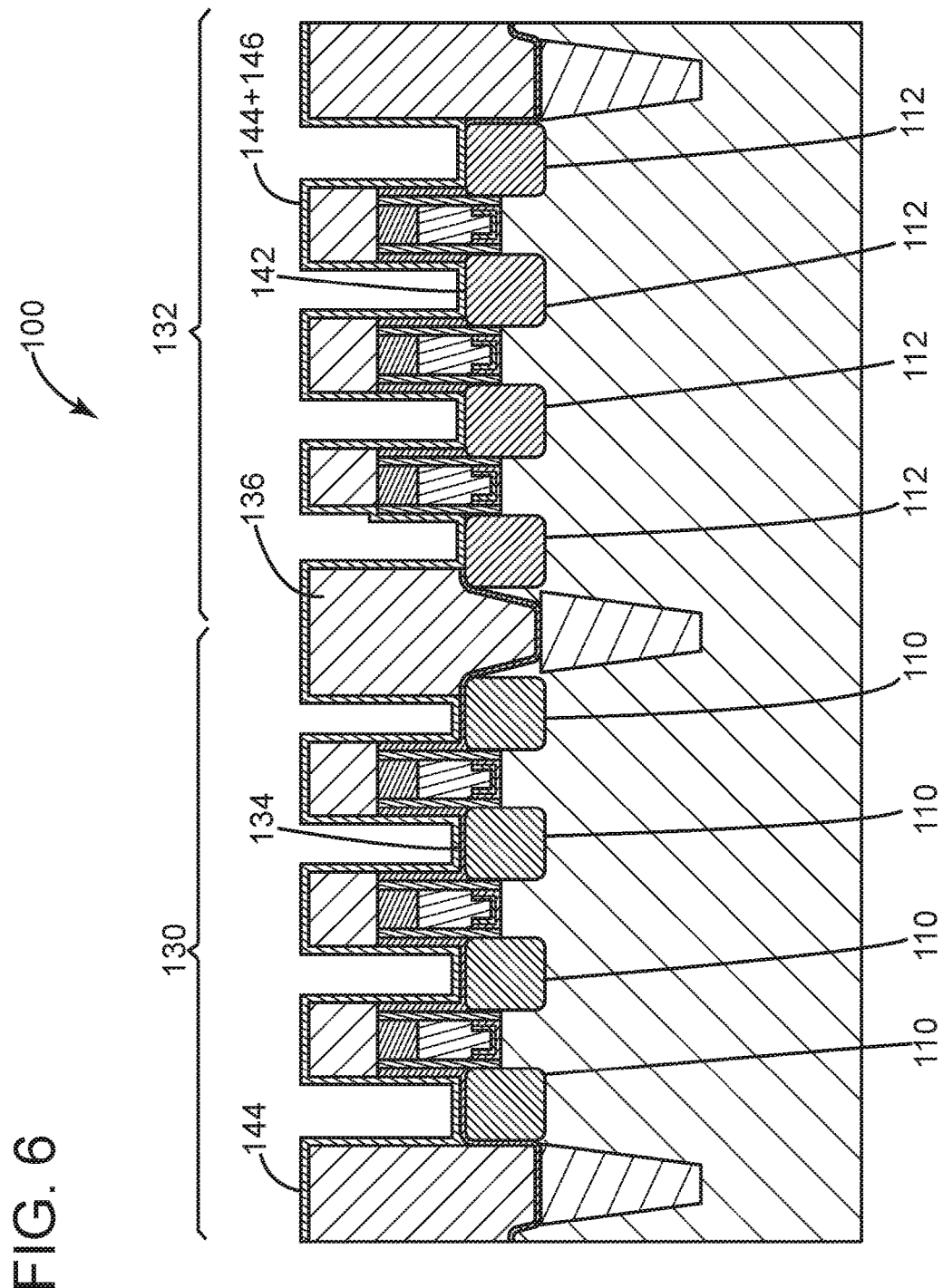
FIG. 6 is a simplified view of the structure of FIG. 5 with a first diffusion layer disposed over the structure in accordance with the present invention.

Referring to FIG. 6, a first diffusion layer 144 is deposited over the structure 100 such that it overlays the top surfaces 142 of the n-type S/D regions 112. Diffusion layer 144 is a solid state diffusion species source, which contains a predetermined high concentration of a first diffusion species 146 (best seen in FIG. 7). The diffusion layer 144 can be an oxide layer, such as a doped silicate glass, that is deposited by such means as plasma enhanced atomic layer deposition or the like. The first diffusion species 146 in this exemplary case is phosphorous, which is an n-type dopant. In this case, a phosphorus-doped silicate glass (PSG) may be used. However, one skilled in the art would recognize that many other n-type dopant species (such as arsenic or similar), may be used to enhance the n-type dopant concentration near the surface 142 of n-type S/D regions 112. Additionally, other elements such as germanium could be introduced using similar techniques.

Figure 7:
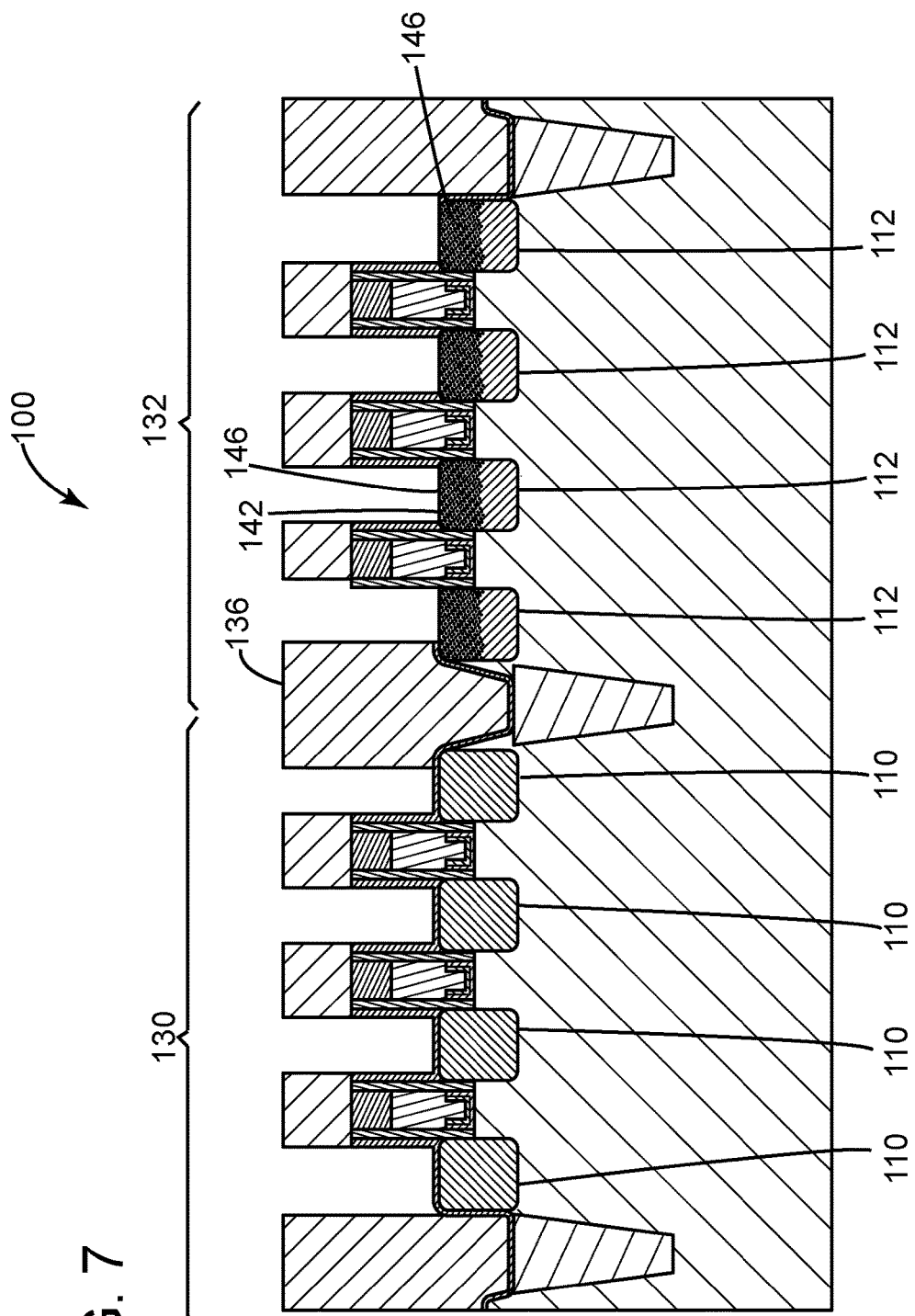
FIG. 7 is a simplified view of the structure of FIG. 6 with an n-type diffusion species diffused into the top surfaces of the n-type S/D regions of the structure in accordance with the present invention.

Referring to FIG. 7, the diffusion layer 144 is heated (e.g., annealed) to diffuse the first diffusion species 146 into the n-type S/D regions 112 to enhance the concentration of the diffusion species 146 proximate the top surface 142 of the S/D regions 112. The diffusion layer is generally heated to a temperature that is within a temperature range of 800 to 1300 degrees centigrade (C). Depending on conditions, the temperature may typically be maintained in that range for a period of as little as 100 milliseconds to up to 5 minutes. In doing so, the concentration of first diffusion species 146 in the S/D regions 112 can be enhanced preferably within 5-20 nanometers (nm) from the top surface 142 of the n-type S/D regions 112. Because the liner layer 134 is kept in place in the p-FET portion 130 of structure 100, the first diffusion species is prevented from diffusing into the p-type S/D regions 110.

It is important to note that, unlike ion implantation processes, heating the solid state diffusion layer 144 to induce diffusion of the diffusion species 146 into the S/D regions 112 does not cause damage, such as amorphization, in those S/D regions. Therefore no further annealing steps will be required to repair such damage and potentially cause the diffusion species 146 to drift further away from the top surfaces 142.

After the diffusion species 146 (in this case the n-type dopant, phosphorous) is driven into the S/D regions 112, the diffusion layer 144 is removed from the top surface 142 of the S/D regions 112, as well as from the rest of the structure 100. In this particular case, the phosphorus-doped silicate glass (PSG) diffusion layer 144 is removed with a well-known PSG strip process.

Figure 8:
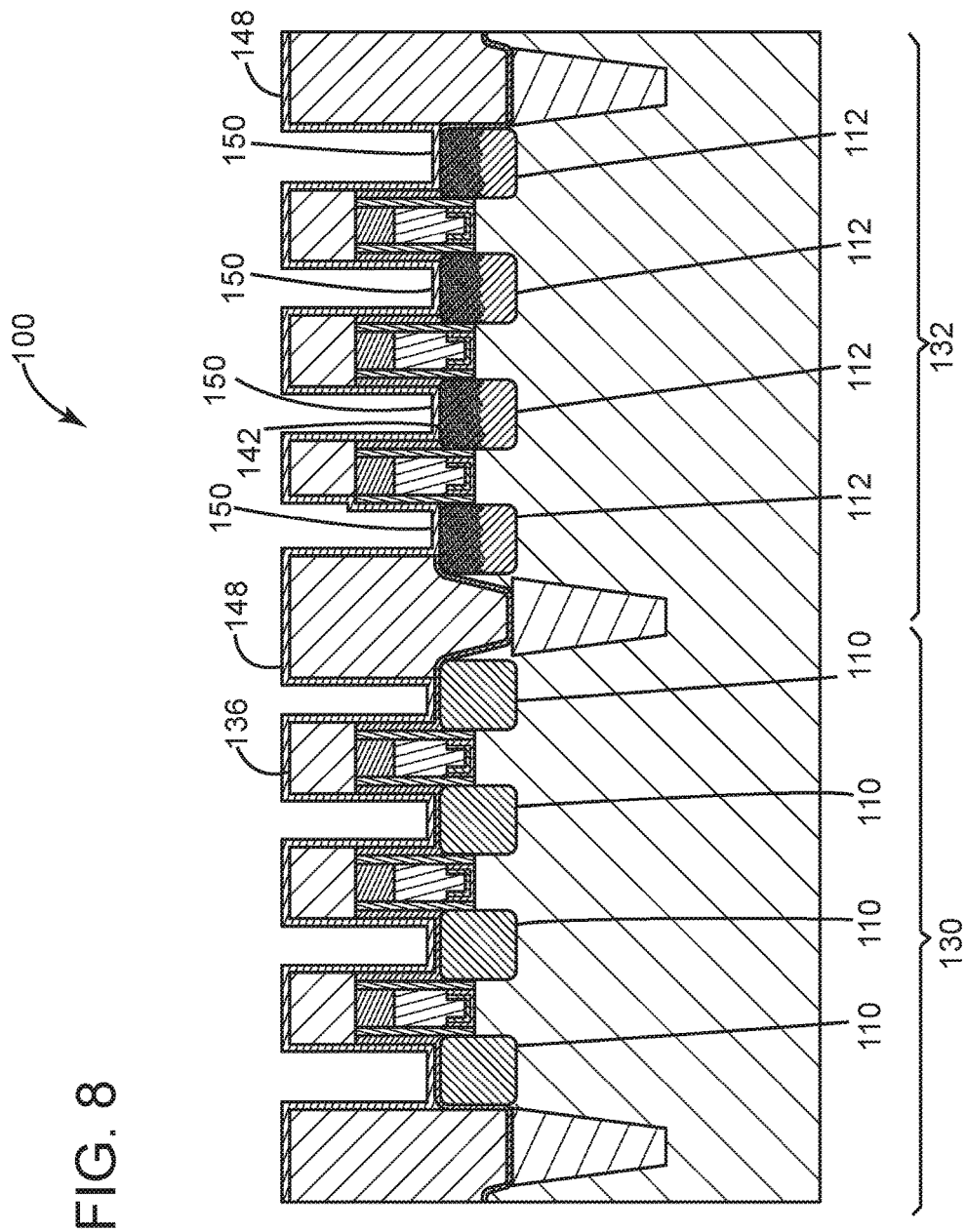
FIG. 8 is a simplified view of the structure of FIG. 7 with a solid state silicide metal layer, an n-type metal contact liner to lower Schottky barrier height, disposed over the structure in accordance with the present invention.

Referring to FIG. 8, a metal layer 148 is deposited over the top surface 142 of the n-type S/D regions 112, as well as the rest of structure 100, immediately after removing the first diffusion layer 144 to begin the process of forming electrical contacts. The metal layer 148 in this example is titanium (Ti), which has lower Schottky barrier height for n-type S/D regions, but can be other metals as well, such as nickel (Ni), cobalt (Co) or the like. The metal layer 148 is preferably conformally coated over the structure 100 via well-known processes such as chemical vapor deposition, atomic layer deposition or the like, but may also be non-conformally coated. A barrier layer (not shown), such as titanium nitride (TiN) or tungsten carbide or tungsten nitride or the like, is also deposited in some methods to protect the silicide layer and act as an adhesion layer for subsequent metal fill.

There are a number of ways to form electrical contacts from the metal layer 148 that are suitable for providing low resistance electrical continuity between the S/D regions 112 and the electrical interconnect system (not shown) of structure 100. In this particular exemplary embodiment heat (such as in an annealing process) is applied to the metal layer 148 to induce a reaction with the silicon of the top surface 142 of n-type S/D regions 112 and form a silicide 150 that is disposed directly over the top surfaces 142. The remainder of the metal layer 148 covering structure 100 that does not contact the silicon of the n-type S/D regions 112 does not react and does not form a silicide. This includes the p-FET portion 130 of structure 100 where the p-type S/D regions 110 are protected by the liner layer 134 from contact with the metal layer 148.

Besides formation of silicides 150, one skilled in the art would recognize that there are other methods of forming electrical contacts over the top surfaces 142 of the S/D regions 112 from the metal layer 148. For example, low-resistance Ohmic or Schottky contacts (which may or may not be silicides) can be formed without annealing on some materials.

It is important to note that the first diffusion species 146 have been introduced into the n-type S/D regions 112 just prior to electrical contact formation (in this case, just prior to silicidation). Since silicidation is one of the last process steps in electrical contact formation, a majority of high temperature processes that can affect the concentration and location of the diffusion species 146 are avoided.

Once the silicidation process is completed on the n-FET portion 132 of structure 100, the unreacted metal layer 148 may be stripped away or left in place. In this exemplary embodiment the remaining unreacted metal layer 148 is left in place during subsequent electrical contact formation.

Figure 9:
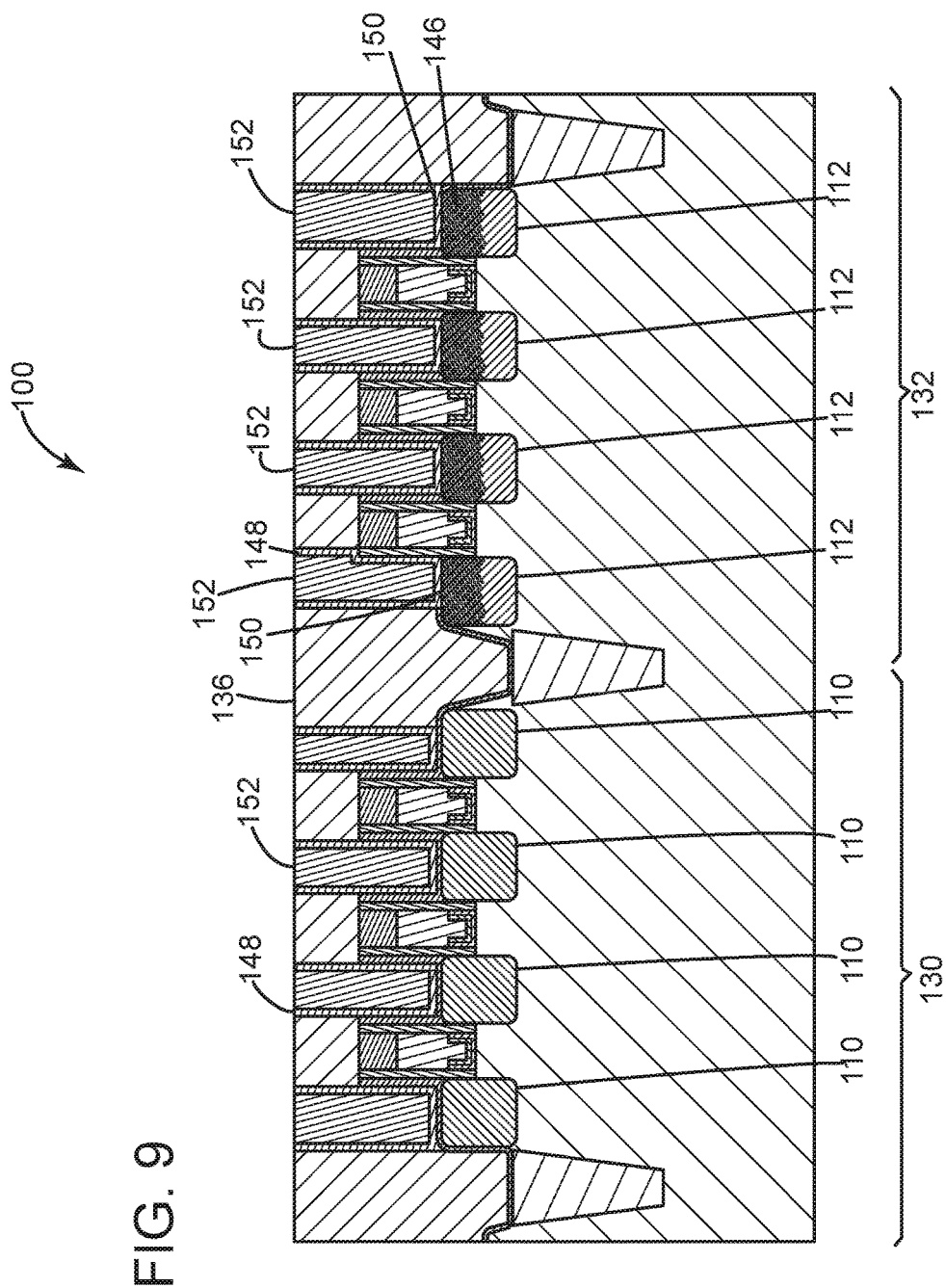
FIG. 9 is a simplified view of the structure of FIG. 8 with a fill metal disposed over the n-type S/D regions of the structure in accordance with the present invention.

Referring to FIG. 9, a fill metal 152 is then deposited over the silicides 150 in the n-type S/D regions 112, as well as the rest of structure 100, to form electrical contacts between the semiconductor devices of the n-FET portion 132 of the of structure 100 and an upper metal interconnect system (not shown) of the integrated circuit associated with structure 100. More specifically, the fill metal 152 forms electrical contacts between the interconnect system of the integrated circuit and the silicided n-type S/D regions 150.

In this exemplary embodiment, the fill metal 152 is tungsten (W), however other appropriate metals, such as cobalt or the like, may also be used. The fill metal may be deposited by any one of several well-known techniques, such as chemical vapor deposition, electroless plating or the like. Once the fill metal 152 has been deposited over the silicides 150, the structure 100 is planarized by well-known techniques such as chemical mechanical polishing (CMP).

At this point, the electrical contact formation on the n-FET portion 132 of structure 100 has been completed. Advantageously, the n-type S/D regions 112 have had a high concentration of the first diffusion species 146 deposited proximate to the top surface 142 of the S/D regions 112 without damage to those regions, because the diffusion species 146 was diffused into the S/D regions 112 from the solid state diffusion layer 144. Additionally, because the diffusion species 146 were introduced into S/D regions 112 just prior to silicidation, a number of elevated temperature processes that could have affected the concentration and location of diffusion species 146 were avoided.

Figure 10:
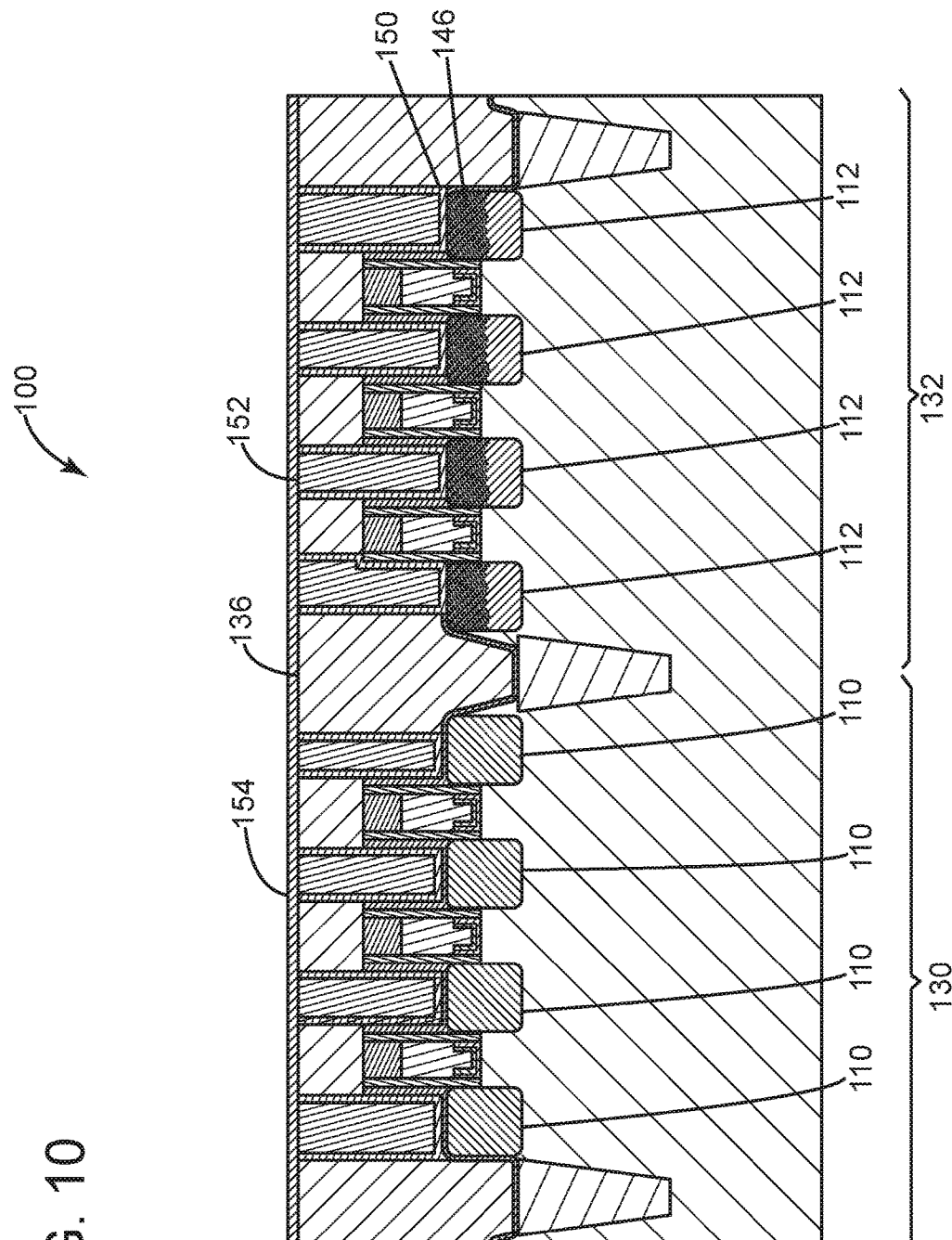
FIG. 10 is a simplified view of the structure of FIG. 9 with a dielectric screen layer disposed over the structure in accordance with the present invention.

Referring to FIG. 10, a dielectric screen layer 154 is deposited over structure 100. The purpose of the dielectric screen layer 154 is to protect the work done on the n-FET portion 132 of structure 100 from damage during subsequent process steps on the p-FET portion 130 of structure 100. The dielectric screen layer 154 may be a silicon nitride (SiN) layer, a silicon dioxide (SiO2) layer or the like.

Figure 11:
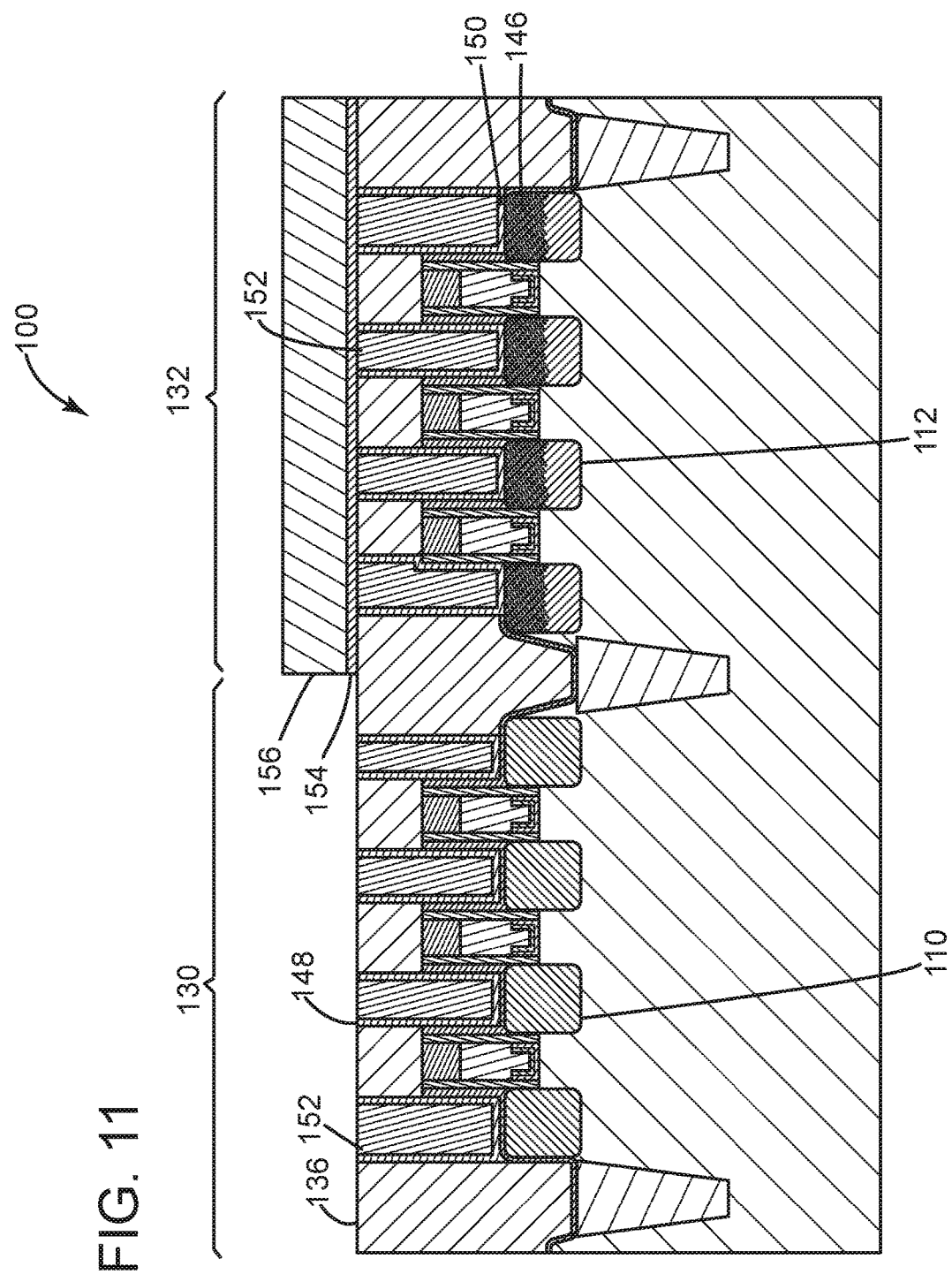
FIG. 11 is a simplified view of the structure of FIG. 10 with a block mask layer disposed over the n-FET portion of the structure in accordance with the present invention.

Referring to FIG. 11, the dielectric screen layer 154 is removed from the p-FET portion 130 of structure 100 using lithographic patterning of another block layer 156, such as an OPL or the like. This exposes the fill metal 152, the unreacted silicide metal layer 148 and the oxide layer 136 on the p-FET portion 130 of structure 100.

Therefore, the block layer 156 and the remaining portion of the dielectric screen layer 154 overlay the entire n-FET portion 132 including the n-type S/D regions 112, the silicides 150 and the fill metal 152.

Figure 12:
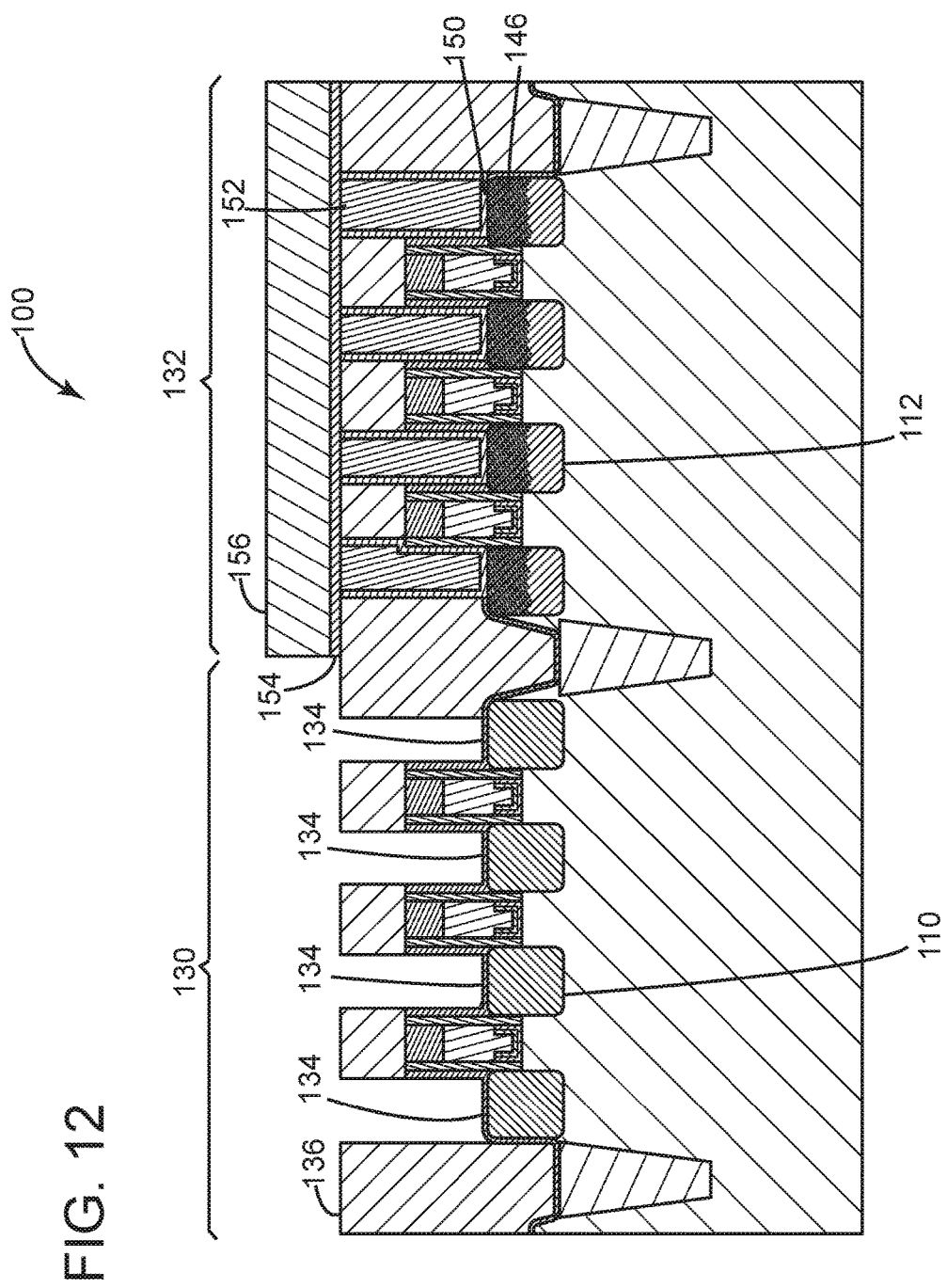
FIG. 12 is a simplified view of the structure of FIG. 11 with fill metal removed from the p-FET portion of the structure in accordance with the present invention.

Referring to FIG. 12, to prepare the p-FET portion 130 of structure 100 for electrical contact formation, the fill metal 152 and the unreacted silicide metal layer 148 are selectively etched away. Therefore the nitride layer 134 over the p-type S/D regions 110 is exposed.

Figure 13:
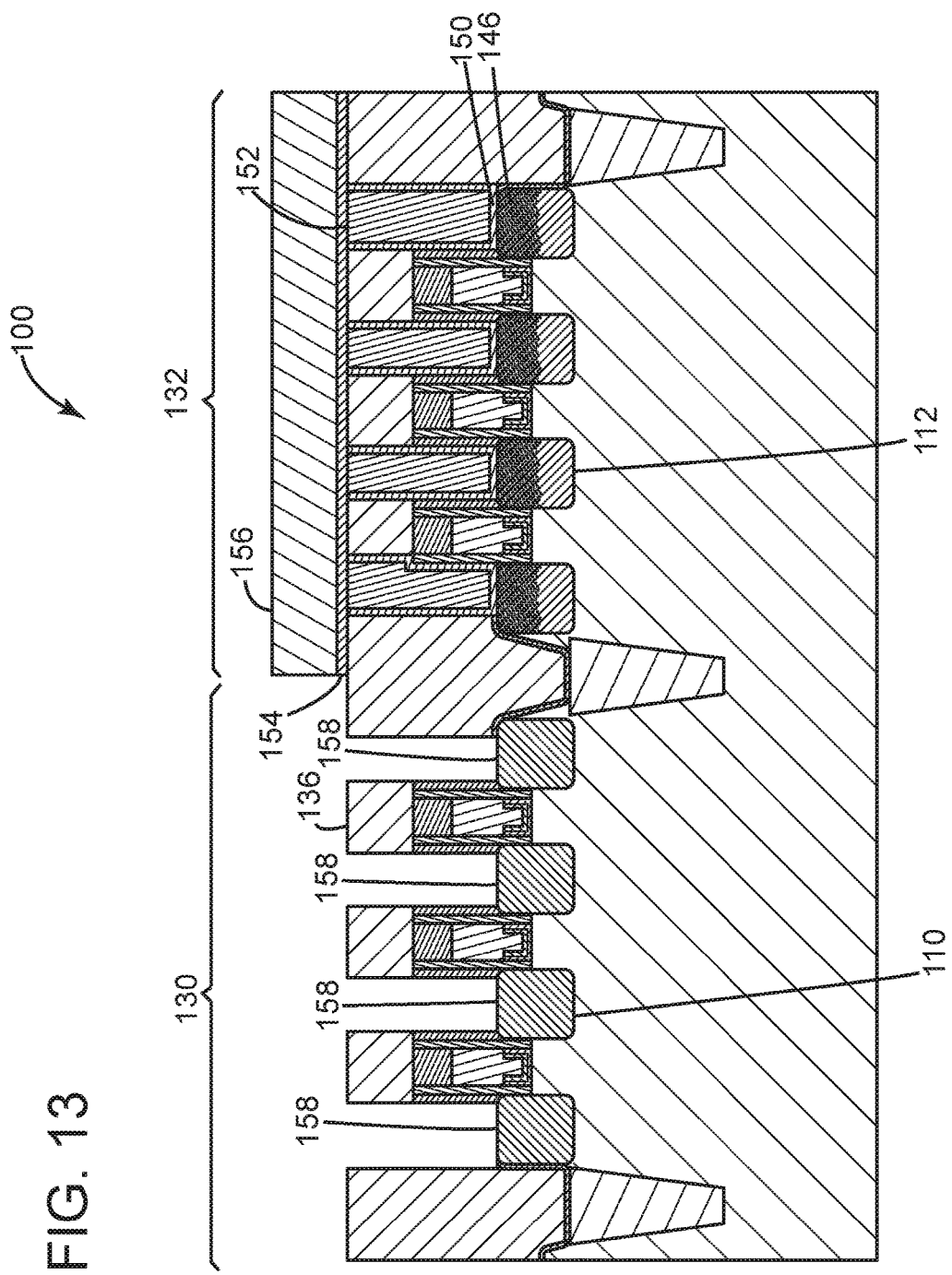
FIG. 13 is a simplified view of the structure of FIG. 12 with top surfaces of the p-type S/D regions exposed in accordance with the present invention.

Referring to FIG. 13, an etch process is used to etch the exposed portions of nitride liner layer 134 away on the p-FET portion 130 of structure 100, which exposes the top surfaces 158 of the p-type S/D regions 110. The etch process is an anisotropic etch, such as a reactive ion etch (RIE).

Figure 14:
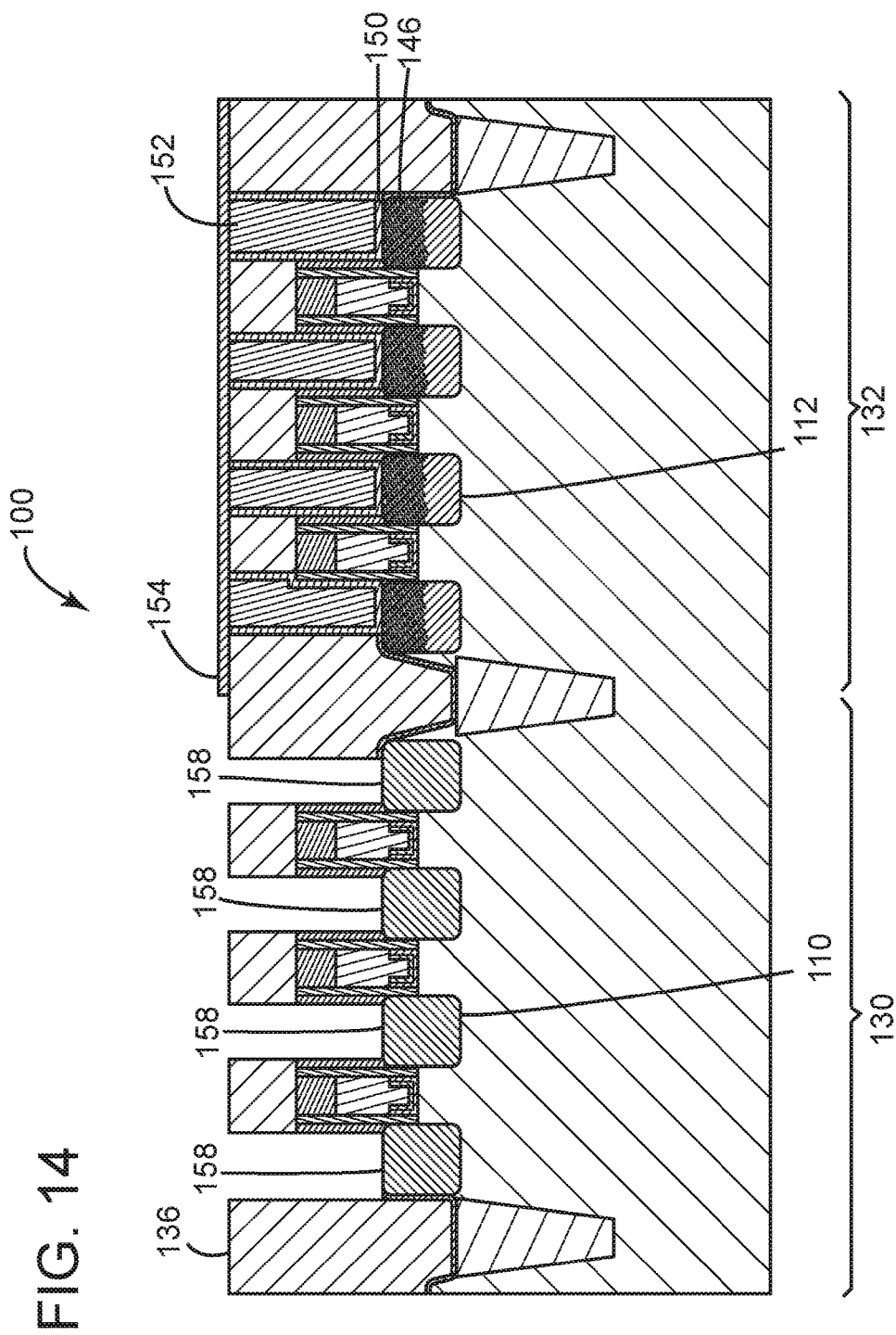
FIG. 14 is a simplified view of the structure of FIG. 13 with the block mask removed in accordance with the present invention.

Referring to FIG. 14, the block mask layer 156 is stripped away. The dielectric screen layer 154 remains overlaying the n-FET portion 132 of structure 100.

Figure 15:
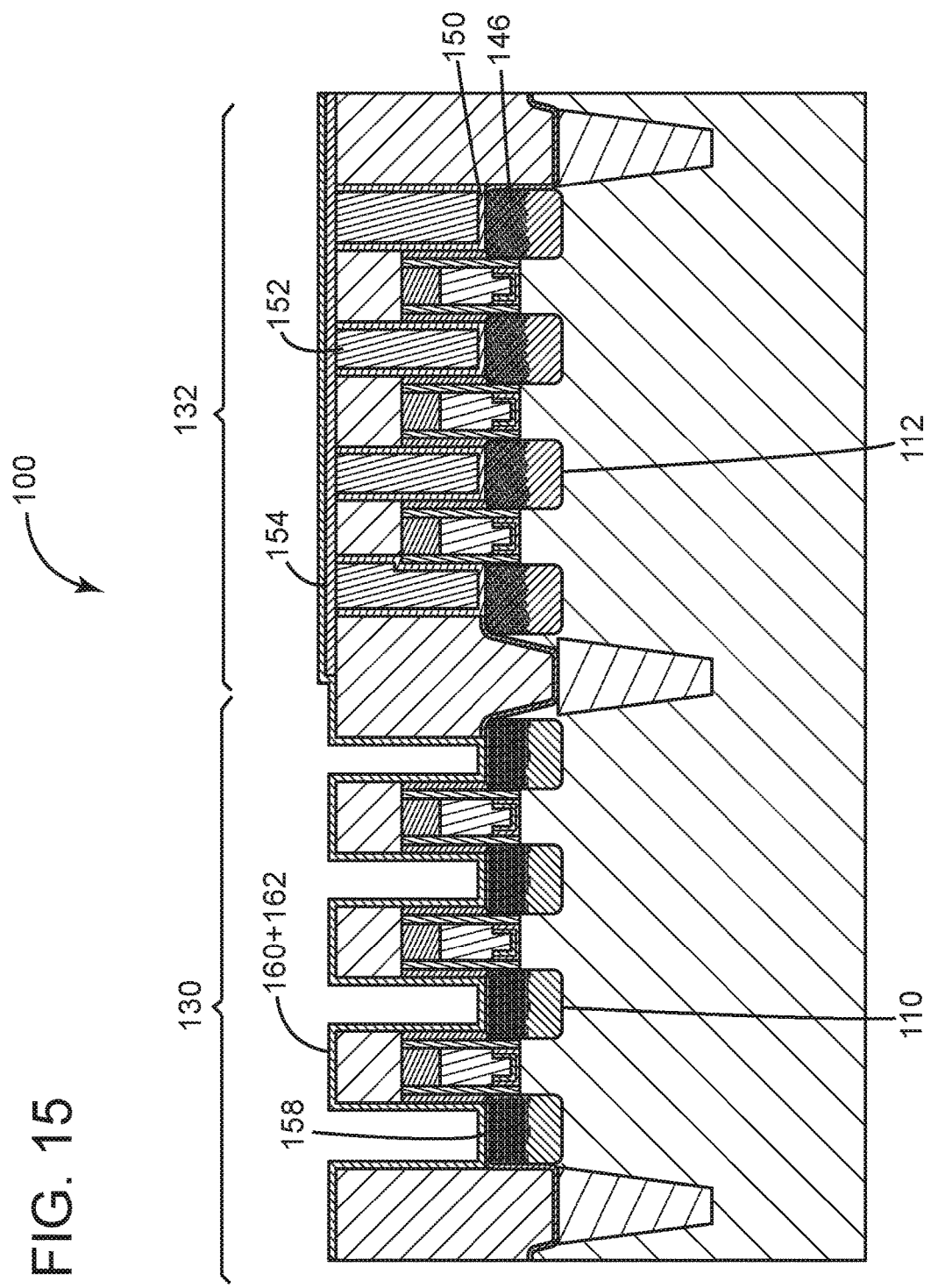
FIG. 15 is a simplified view of the structure of FIG. 14 with a second diffusion layer disposed over the structure in accordance with the present invention.

Referring to FIG. 15, a second diffusion layer 160 is deposited over the structure 100 such that it overlays the top surfaces 158 of the p-type S/D regions 110. Diffusion layer 160 is a solid state diffusion source, which contains a predetermined high concentration of a second diffusion species 162 (best seen in FIG. 16). The diffusion layer 160 can be an oxide layer, such as a doped silicate glass, that is deposited by such means as plasma enhanced atomic layer deposition or the like. The second diffusion species 162 in this exemplary case is boron, which is a p-type dopant, so material 160 in this case may be a boron-doped silicate glass (BSG). However, one skilled in the art would recognize that many other p-type dopant species (such as gallium or similar) may be used as a diffusion species to enhance the p-type dopant concentration near the surface 158 of p-type S/D regions 110. Additionally, other elements such as germanium could be introduced using similar techniques.

Figure 16:
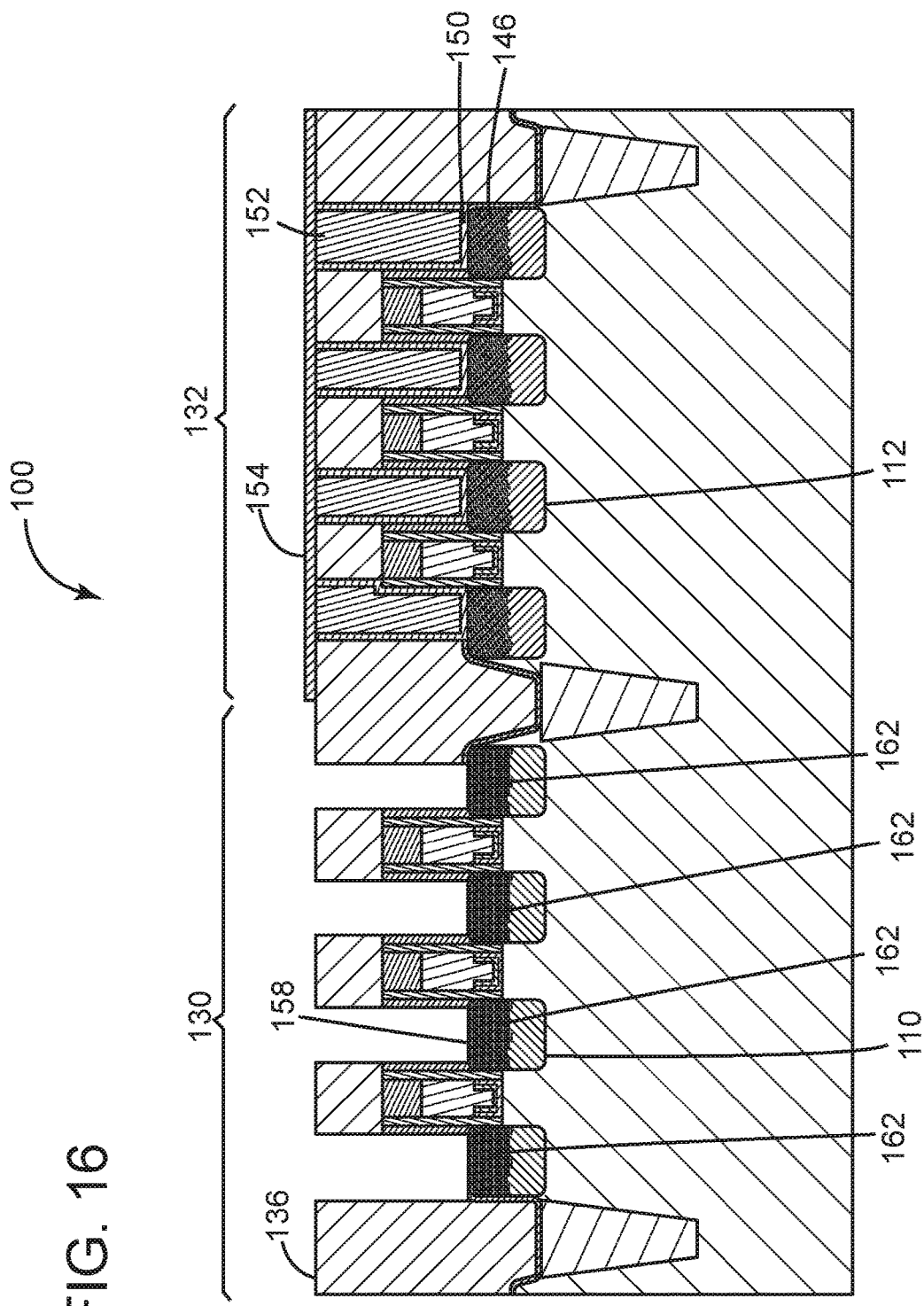
FIG. 16 is a simplified view of the structure of FIG. 15 with a p-type diffusion species diffused in to the top surfaces of the p-type S/D regions of the structure in accordance with the present invention.

Referring to FIG. 16, the second diffusion layer 160 is heated (e.g., annealed) to diffuse the second diffusion species 162 into the p-type S/D regions 110 to enhance the concentration of the second diffusion species 162 proximate to the top surface 158 of the S/D regions 110. The diffusion layer is generally heated to a temperature that is within a temperature range of 800 to 1300 degrees centigrade (C). Depending on conditions, the temperature may typically be maintained in that range for a period of as little as 100 milliseconds to up to 5 minutes. In doing so, the concentration of second diffusion species 162 in the S/D regions 110 can be enhanced preferably within 5-20 nanometers (nm) from the top surface 158. Because the dielectric screen layer 154 is kept in place in the n-FET portion 132 of structure 100, the second diffusion species is prevented from diffusing into and damaging the fill metal 152, the n-type S/D regions 112 or any other structural features in the n-FET portion 132.

It is important to note that, unlike ion implantation processes, heating the solid state second diffusion layer 160 to induce diffusion of the second diffusion species 162 into the S/D regions 110 does not cause damage, such as amorphization, in those S/D regions. Therefore no further annealing steps will be required to repair such damage and potentially cause the second diffusion species 162 to drift further away from the top surfaces 158.

After the second diffusion species 162 (in this case the p-type dopant, boron) is driven into the S/D regions 110, the diffusion layer 160 is removed from the top surface 158 of the S/D regions 110, as well as from the rest of the structure 100. In this particular case, the boron silicate glass (BSG) diffusion layer 160 is removed with a well known BSG strip process.

Referring to FIG. 17, a second metal layer 164 is deposited over the top surface 158 of the p-type S/D regions 110, as well as the rest of structure 100, immediately after removing the second diffusion layer 160 to begin a second process of forming electrical contacts. The metal layer 164 in this example is nickel (Ni) which has lower Schottky barrier height for p-type S/D regions, but can be other metals as well, such as Titanium (Ti) or the like. The second metal layer 164 is preferably conformally coated over the structure 100 via well known processes such as chemical vapor deposition, atomic layer deposition or the like, but may also be non-conformally coated. A barrier layer (not shown), such as titanium nitride (TiN) or tungsten carbide or tungsten nitride or the like, is also deposited in some methods to protect the silicide layer and act as an adhesion layer for subsequent metal fill.

As discussed earlier with respect to FIG. 8, there are a number of ways to form electrical contacts from the metal layer 164 that are suitable for providing low resistance electrical continuity between the S/D regions 110 and the electrical interconnect system (not shown) of structure 100. In this particular exemplary embodiment heat (such as in an annealing process) is applied to the metal layer 164 to induce a reaction with the silicon of the top surface 158 of p-type S/D regions 110 and form a second silicide 166 that is disposed directly over the top surfaces 158. The remainder of the second metal layer 164 covering structure 100 that does not contact the silicon of the p-type S/D regions 110 does not react and does not form a silicide.

Besides formation of second silicides 166, one skilled in the art would recognize that there are other methods of forming electrical contacts over the top surfaces 158 of the S/D regions 110 from the metal layer 164. For example, low-resistance Ohmic or Schottky contacts (which may or may not be silicides) can be formed without annealing on some materials.

It is important to note that the second diffusion species 162 have been introduced into the p-type S/D regions 110 just prior to electrical contact formation (in this case silicidation). Since silicidation is one of the last process steps in electrical contact formation, a majority of high temperature processes that can affect the concentration and location of the diffusion species 162 are avoided.

Once the silicidation process is completed on the p-FET portion 130 of structure 100, the unreacted second metal layer 164 may be stripped away or left in place. In this exemplary embodiment the remaining unreacted second metal layer 164 is left in place during subsequent electrical contact formation.

Referring to FIG. 18, a second fill metal 168 is then deposited over the second silicides 166 in the p-type S/D regions 110, as well as the rest of structure 100, to form electrical contacts between the semiconductor devices of the p-FET portion 130 of the of structure 100 and an electrical interconnect system (not shown) of the integrated circuit associated with structure 100. More specifically, the fill metal 168 forms electrical contacts between the interconnection system of the integrated circuit and the silicided p-type S/D regions 166.

In this exemplary embodiment, the second fill metal 168 is tungsten (W), however other appropriate metals, such as cobalt or the like, may also be used. The second fill metal 168 may be deposited by any one of several well-known techniques, such as chemical vapor deposition, electroless plating or the like.

Referring to FIG. 19, once the second fill metal 168 has been deposited over the second silicides 166, the structure 100 is planarized by well-known techniques such as chemical mechanical polishing (CMP) down to the top of the oxide layer 136. The planarization process, therefore, exposes both the top portions of the fill metal 152 and the second fill metal 168.

At this point, the electrical contact formation on both the p-FET portion 130 and the n-FET portion 132 of structure 100 has been completed. Advantageously, the p-type and n-type S/D regions 110 and 112 have had a high concentration of the first and second diffusion species 146 and 162 respectively deposited proximate the top surfaces 158, 142 of the p-type and n-type S/D regions 110, 112 respectively without damage to those regions, because the diffusion species 146 and 162 were diffused into the S/D regions 110 and 112 from the solid state diffusion layers 144 and 162. Additionally, because the species 146 and 162 were introduced into S/D regions 110 and 112 just prior to silicidation, a number of heating processes that could have affected the concentration and location of diffusion species 146 and 162 were avoided. Furthermore, this methodology enables one to choose from a greater selection of silicide metals for both n- and p-type S/D contacts, in order to reduce Schottky barrier height.

Although the invention has been described by reference to specific embodiments, it should be understood that numerous changes may be made within the spirit and scope of the inventive concepts described. Accordingly, it is intended that the invention not be limited to the described embodiments, but that it have the full scope defined by the language of the following claims.

The invention claimed is:

1. A method comprising:
providing a substrate for an integrated circuit;
forming an n-type and a p-type S/D region for a semiconductor device on a surface of the substrate;
exposing a top surface of solely one type of the n-type and p-type S/D regions;
depositing a diffusion layer over the top surface of the one type of S/D regions, the diffusion layer having a predetermined concentration of a first diffusion species;
heating the diffusion layer to diffuse the first diffusion species into the one type of S/D regions to enhance a concentration of the first diffusion species proximate the top surface of the one type of S/D regions;
removing the diffusion layer from the top surface of the one type of S/D regions;
depositing a metal layer over the top surface of the one type of S/D regions immediately after removing the diffusion layer;
forming electrical contacts over the top surface of the one type of S/D regions from the metal layer;
depositing a dielectric screen layer over the one type of S/D regions;
exposing a top surface of solely the other type of the n-type and p-type S/D regions;
depositing a second diffusion layer over the top surface of the other type of S/D regions, the second diffusion layer having a predetermined concentration of second diffusion species; and
heating the second diffusion layer to diffuse the second diffusion species into the other type of S/D regions to enhance a concentration of the second diffusion species proximate the top surface of the other type of S/D regions.

2. The method of claim 1 wherein the metal layer is chosen to reduce Schottky barrier height for the one type of S/D regions.

3. The method of claim 1 wherein the first and second diffusion species are one of an alloying element, an n-type dopant and a p-type dopant.

4. The method of claim 1 comprising;
heating the metal layer to form a silicide over the top surface of the one type of S/D regions; and
using the silicide to form an electrical contact between the semiconductor device and an interconnection system of the integrated circuit.

5. The method of claim 1 wherein heating the diffusion layer comprises:
heating the diffusion layer at a temperature within a temperature range of 800 to 1300 degrees centigrade;
maintaining the temperature within the temperature range for a period of 100 milliseconds to 5 minutes; and
diffusing the first diffusion species into the one type of S/D regions to enhance a concentration of the first diffusion species within 20 nanometers from the top surface of the one type of S/D regions.

6. The method of claim 5 comprising diffusing the first diffusion species into the one type of S/D regions to enhance a concentration of the first diffusion species within 10 nanometers from the top surface of the one type of S/D regions.

7. A method comprising:
providing a substrate for an integrated circuit;
forming a plurality of n-type and p-type S/D regions for a plurality of semiconductor devices on a surface of the substrate;
exposing top surfaces of solely one type of the n-type and p-type S/D regions;
depositing a diffusion layer over the top surfaces of the one type of S/D regions, the diffusion layer having a predetermined concentration of a first diffusion species;
heating the diffusion layer to diffuse the first diffusion species into the one type of S/D regions to enhance a concentration of the first diffusion species proximate the top surfaces of the one type of S/D regions;
removing the diffusion layer from the top surfaces of the one type of S/D regions;
depositing a metal layer over the top surfaces of the one type of S/D regions immediately after removing the diffusion layer; and
forming electrical contacts over the top surfaces of the one type of S/D regions from the metal layer;
depositing a dielectric screen layer over the one type of S/D regions;
exposing top surfaces of solely the other type of the n-type and p-type S/D regions;
depositing a second diffusion layer over the top surfaces of the other type of S/D regions, the second diffusion layer having a predetermined concentration of a second diffusion species; and
heating the second diffusion layer to diffuse the second diffusion species into the other type of S/D regions to enhance a concentration of the second diffusion species proximate the top surfaces of the other type of S/D regions.

8. The method of claim 7 comprising:

heating the metal layer to form silicides over the top surfaces of the one type of S/D regions; and depositing a fill metal over the silicides of the one type of S/D regions to form electrical contacts between the semiconductor devices and an interconnection system of the integrated circuit.

9. The method of claim 7 comprising:

removing the second diffusion layer from the top surfaces of the other type of S/D regions;

depositing a second metal layer over the top surfaces of the other type of S/D regions immediately after removing the second diffusion layer; and forming second electrical contacts over the top surfaces of the other type of S/D regions from the second metal layer.

10. The method of claim 9 comprising:

heating the second metal layer to form silicides over the top surfaces of the other type of S/D regions; and depositing a fill metal over the silicides of the other type of S/D regions to form electrical contacts between the semiconductor devices and the interconnection system of the integrated circuit.

11. The method of claim 7 wherein the first and second diffusion species are one of an alloying element, an n-type dopant and a p-type dopant.

12. The method of claim 7 wherein the metal layer is chosen to reduce Schottky barrier height for the one type of S/D regions.

* * * * *